United States Patent [19]

Small et al.

[11] Patent Number: 4,940,671
[45] Date of Patent: Jul. 10, 1990

[54] HIGH VOLTAGE COMPLEMENTARY NPN/PNP PROCESS

[75] Inventors: J. Barry Small, Los Altos; Matthew S. Buynoski, Palo Alto, both of Calif.

[73] Assignee: National Semiconductor Corporation, Santa Clara, Calif.

[21] Appl. No.: 853,530

[22] Filed: Apr. 18, 1986

[51] Int. Cl.$^5$ .......................................... H01L 21/265
[52] U.S. Cl. ...................................... 437/31; 437/228; 437/26; 437/82; 357/34
[58] Field of Search ............. 437/31, 32, 33, 228, 437/225, 238, 239, 247, 248, 26, 81, 82, 27; 357/34, 35; 156/657

[56] References Cited

U.S. PATENT DOCUMENTS

| | | | |
|---|---|---|---|
| 3,702,428 | 11/1972 | Schmitz et al. | |
| 3,723,199 | 3/1973 | Vora | |
| 3,930,909 | 1/1976 | Schmitz et al. | 357/48 |
| 4,038,680 | 7/1977 | Yagi | 357/34 |
| 4,127,864 | 11/1978 | Jochems | 357/35 |
| 4,780,425 | 10/1988 | Tabata | 437/31 |

Primary Examiner—Brian E. Hearn
Assistant Examiner—Kevin McAndrews
Attorney, Agent, or Firm—Gail W. Woodward; Lee Patch; Michael A. Glenn

[57] ABSTRACT

A process is disclosed for forming high-performance high-voltage PNP transistors in a conventional monolithic, planar, PN junction isolated integrated circuit that contains high-performance NPN transistors. The process permits independently optimizing the NPN and PNP transistors.

7 Claims, 2 Drawing Sheets

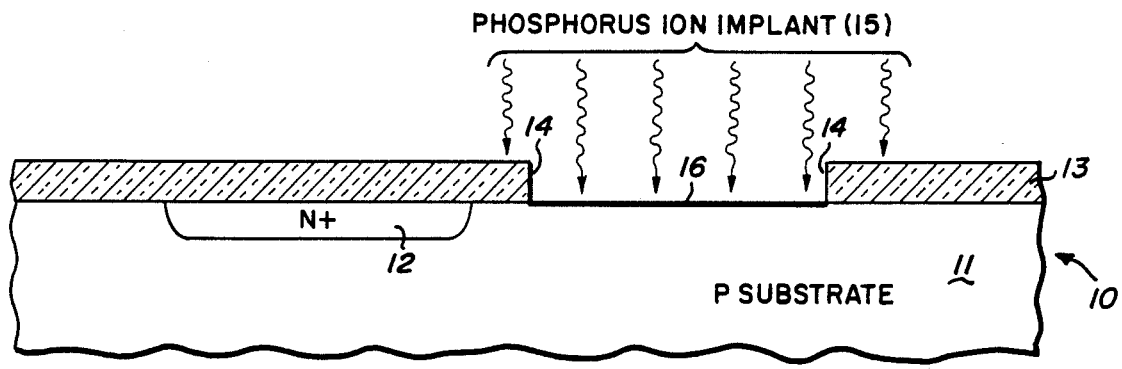
Fig_1
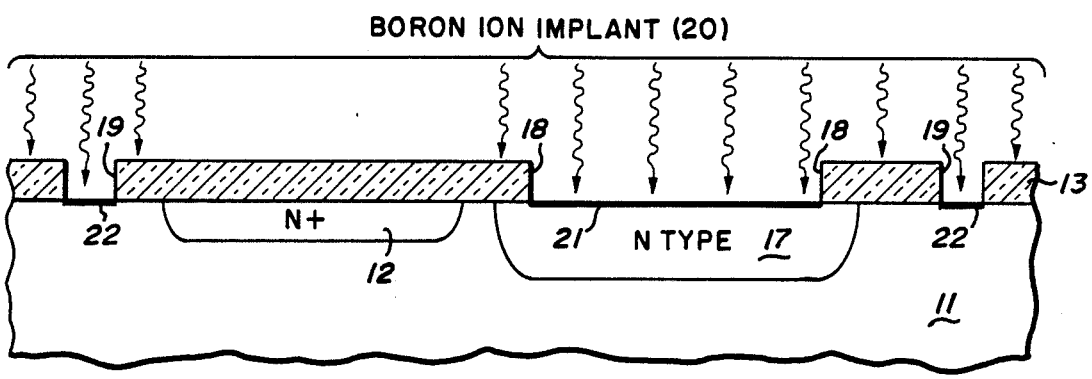
Fig_2
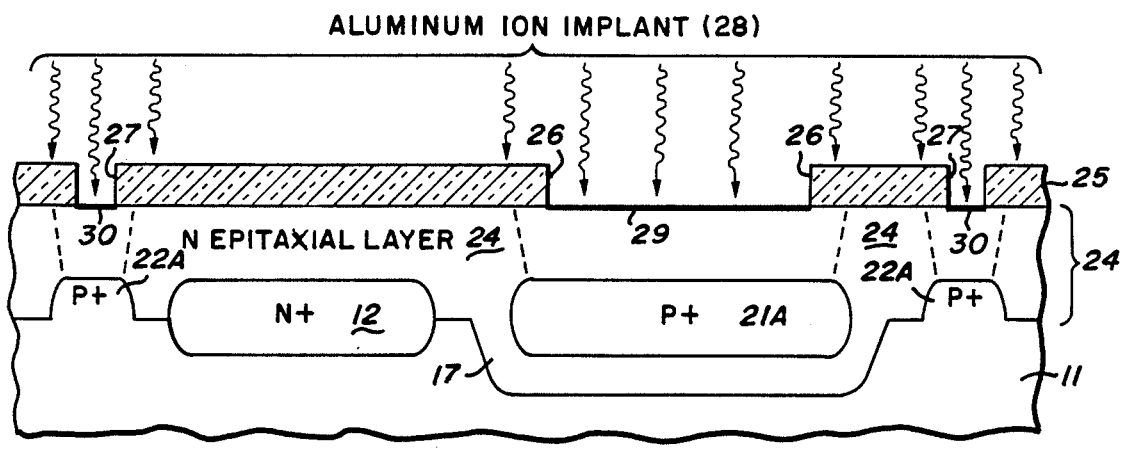
Fig_3

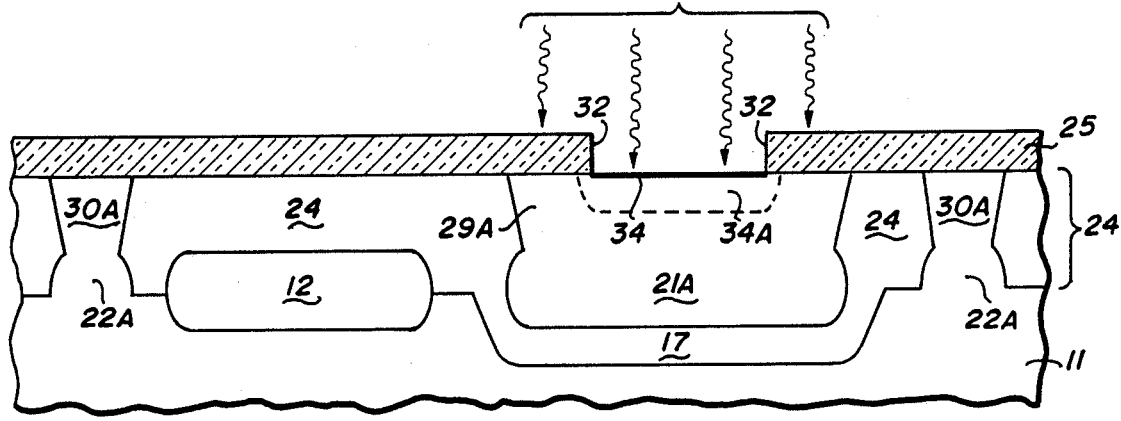
Fig_4
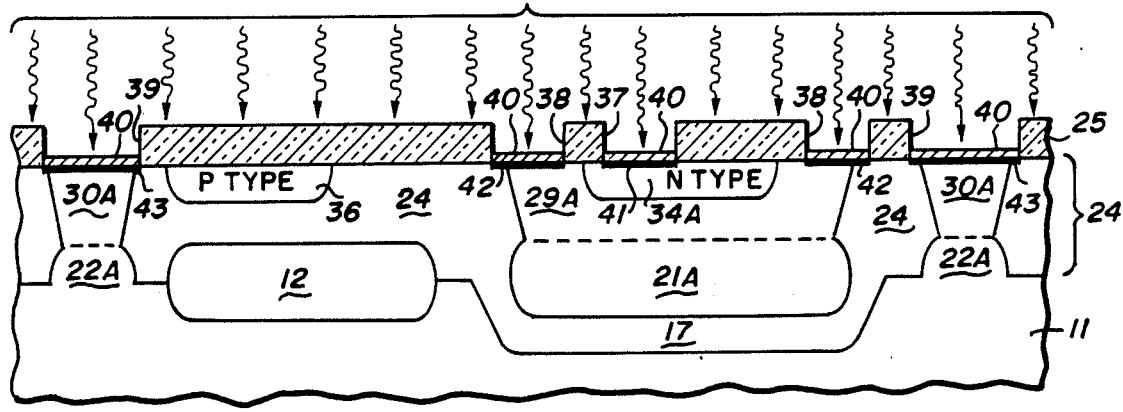
Fig_5
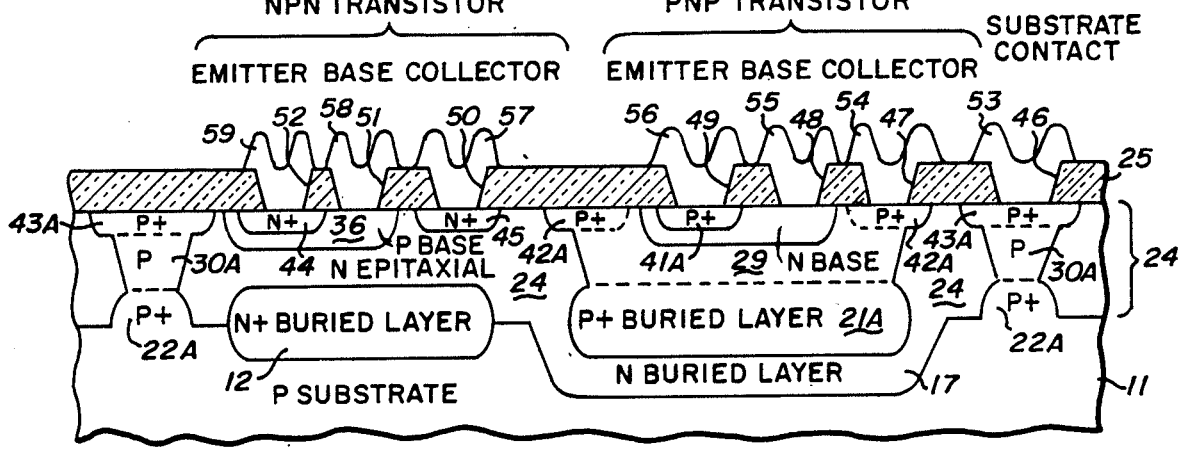
Fig_6

HIGH VOLTAGE COMPLEMENTARY NPN/PNP PROCESS

BACKGROUND OF THE INVENTION

The invention relates to integrated circuit (IC) construction for planar, monolithic, PN-junction-isolated devices. In the conventional structures vertically arrayed NPN transistors can be fabricated to have high Beta (on the order of several hundred) and high operating frequencies (on the order of several hundred MHz). Vertical PNP transistors are commonly substrate dedicated (or connected) collector devices that have a relatively low frequency response, on the order of several tens of MHz. Where a completely isolated PNP device is required, the lateral transistor is ordinarily employed. These devices often display low Beta values less than about 100 and have poor frequency response on the order of several MHz. When lateral PNP transistors are combined with NPN transistors in integrated circuits, unexpected instabilities and other peculiarities can develop to plague the circuit designer who must resort to circuit compromises.

Many attempts have been made to provide high performance PNP transistors for IC use in a process that is compatible with the basic planar NPN structures so that high performance circuits can be achieved. However, these attempts have not been completely successful. Typically, a complementary transistor process does not permit the individual optimization of both of the complementary transistors. The performance of one of the complementary devices often suffers when the process is adjusted to optimize the other device. For example, if the process is altered to improve the PNP transistors, the NPN transistors are degraded.

One example of a successful complementary device process is found in the James L. Dunkley U.S. Pat. No. 3,901,735 which issued to the assignee of the present invention. Here complementary devices are produced in an epitaxial layer that is isolated by diffusion into tubs that contain the active devices. A combination of up-diffusion along with the conventional top surface diffusion is employed to produce isolation diffusion walls which act to isolate sections of the deposited epitaxial layer. Since the isolation diffusion acts to penetrate the epitaxial layer from both top and bottom, the diffusion must extend approximately half way through the layer. This not only reduces the time of isolation diffusion, it also reduces the extent of lateral isolation diffusion and thereby makes for more efficient utilization of the IC surface area.

Another aspect of IC design is related to the thickness of the epitaxial layer. It is desirable to make this layer as thin as possible without degrading device performance. The use of aluminum diffusion in reducing the epitaxial layer thickness is set forth in Amolak R. Ramde et al. U.S. Pat. No. 4,512,816 which also issued to the assignee of the present invention. Here aluminum is employed as the isolation diffusion species. Since Aluminum diffuses much more rapidly than Boron, the usual P-type dopant element in silicon, it can be used to create the required isolation in a relatively short time. This reduces buried layer up-diffusion in the conventional IC structure and therefore permits the use of thinner epitaxial layers. This also reduces the lateral surface diffusion of the isolation and results in increased circuit component density.

The teaching in the above two patents is incorporated herein by reference.

It is desirable to have a complementary IC transistor process for making high voltage (above about 40 volts) transistors wherein the complementary transistors can be individually optimized for their operating characteristics.

SUMMARY OF THE INVENTION

It is an object of the invention to provide an IC fabrication process in which high performance PNP transistors can be fabricated with high performance NPN transistors.

It is a further object of the invention to provide a complementary transistor IC fabrication process in which the complementary transistor performance can be separately optimized.

These and other objects are achieved in a process wherein the conventional PN-junction-isolated, planar, monolithic silicon approach is employed in its ordinary form to make the NPN devices. The PNP devices are fabricated using a P+ collector buried layer that is created in the IC structure by applying P-type impurities to the substrate wafer prior to epitaxy. At the same time the P+ collector buried layer is created it is isolated from the substrate by the establishing of a surrounding N region. These same P type impurities are deposited in the isolation wall regions. Then the epitaxial layer is grown conventionally. The P+ collector and isolation employ aluminum as the active species which can be applied after epitaxy in a short diffusion cycle because of its high diffusion rate. The structure makes use of conventional up-diffusion of the isolation and P+ collector buried layer to permit the establishing of an isolated PNP transistor of vertical construction. The P+ buried layer will serve to reduce PNP transistor collector resistance. After the P collector is created an N-type base is implanted and diffused using an N-type impurity located within the confines of the P well. Then a heavy concentration of P type impurities is formed to create the PNP transistor emitters within the confines of the base. At the same time, P type impurities are introduced around the periphery of the P well and as a cap over the isolation region. By this means the aluminum doping is overcoated with heavily doped P type material. The above steps are incorporated into the conventional IC process that is used to create the NPN transistors and the other IC circuit elements such as resistors, diodes and capacitors. Since each of the elements of the PNP transistors are created in separate steps, the performance of the PNP as well as the NPN transistors can be separately optimized.

It is essential that the P− collector dopant have a high diffusion rate. In order to achieve high voltage devices ($BV_{CEO}>40$ volts) it is necessary to have large vertical dimensions to accommodate depletion region spreads. With a diffusant such as boron acting as the P+ buried collector region of the PNP devices it can expand during processing thereby requiring thick epitaxial layers to achieve the required breakdown voltage. The utility of such thick epitaxial layers can be diminished by the long diffusion times needed to produce isolation. The use of aluminum in the P− collector and isolation walls avoids this problem.

BRIEF DESCRIPTION OF THE DRAWING

FIGS. 1–6 are cross-section drawings of a fragment of a silicon wafer showing the creation of complementary transistors. The various drawings illustrate the steps in the fabrication process.

The drawing is not to scale. The vertical dimensions have been exaggerated for clarity.

DESCRIPTION OF THE INVENTION

The various figures in the drawing represent the critical process steps employed in practicing the invention. A fragment of an IC wafer 10 is shown in cross section. The section shows a portion of the wafer that will contain a pair of complementary transistors isolated by means of PN junctions from the remainder of the circuit. It is to be understood that the various processing steps will be presented with respect to the conventional planar wafer processing. Unless otherwise specified, conventional photolithographic, oxide-masked, diffusion processing is assumed. In the various figures the oxide is shown idealized and no attempt is made to portray the actual oxide or the surface steps that ordinarily accompany planar processing.

In FIG. 1, substrate 11 is a conventional P-type wafer. An N+ region is shown at 12. This is typically an arsenic or antimony-diffused region that will become a buried layer that is to be located under an NPN transistor. The wafer is covered by a surface oxide 13. A hole 14 is photolithographically etched in oxide 13 in that region where a PNP transistor is to be fabricated. As shown in FIG. 1, phosphorous ions 15 are implanted into the wafer inside hole 14. The remainder of oxide 13 will mask the ion implant. A dose of about $10^{13}$ atoms/cm$^2$ is applied at an energy of about 100 keV. Therefore, phosphorous will be applied to the exposed substrate to produce a phosphorous doped region 16. The wafer is then diffused at about 1270° C. for about 8 hours to produce an N type region 17 as shown in FIG. 2. While region 17 is shown close to its final location, it is to be understood that this is only an approximation. Actually, the penetration of region 17 will expand somewhat during subsequent high temperature process steps. The shape of region 17 will not be drastically altered because the diffusion temperature is higher than subsequent heat treatment steps. Any alteration that would be produced by subsequent processing will be compensated by adjusting the diffusion so that the final location of region 17 is as desired. Region 17 forms a PN-isolation junction with substrate 11 and the implant dosage is designed to produce a final breakdown voltage (after all processing is completed) that is well in excess of the desired 40 volts. During this diffusion oxide 13 is regrown so that it again covers the wafer as is well known in planar processing.

Then, as shown in FIG. 2, the oxide is photolithographically etched to create hole 18 and ring 19. Hole 18 is located, within the confines of N type region 17, where the PNP transistor buried layer is to be located. The ring 19 represents the isolation wall that will be established subsequently. This ring will ultimately result in a P-type region (or wall) that will extend completely through a subsequently applied N type epitaxial layer. Thus, the epitaxial layer will be divided up into a plurality of PN-junction-isolated tubs which can contain electrically separate active IC components. At this point, a boron ion implant 20 is applied at a dose of about $5 \times 10^{14}$ atoms/cm$^2$ at about 200 keV. This creates boron rich region 21 and ring 22.

At this point, oxide 13 is completely stripped from wafer 11 and an N-type epitaxial layer of about 5 ohm-centimeter conductivity is grown over the wafer. This layer is shown at 24 in FIG. 3. During epitaxy N+ buried layer 12 will extend upward into layer 24. The boron rich region 21 will diffuse both into layer 24 and into substrate 11. This will create a heavily doped buried P region 21A. A similar condition is associated with region 22 which will diffuse boron into layer 24 to create a P+ isolation ring 22A. The uppermost reaches of region 22A will be at the same level as region 21A.

After epitaxy a new oxide layer 25 is created to cover the wafer. This oxide is photolithographically etched with a pattern closely matching that of FIG. 2 to create a hole 26 and a ring 27. Then aluminum ions 28 are implanted into the wafer. A dose of about $2 \times 10^{14}$ atoms/cm$^2$ is deposited at about 180 keV to create aluminum-rich regions 29 and 30. In FIG. 3 the dashed lines represent the aluminum diffusion that will occur during a heat treatment at about 1150° C. for about 70 minutes. The result of this diffusion step is as shown in FIG. 4. The aluminum ion 28 dose is selected so that region 29A is doped to the desired level which controls the collector region resistivity of the PNP transistors. It will be noted that regions 21A and 29A combine to form a P-type island completely surrounded by N type material. This island, which will become the collector of a PNP transistor is thus PN junction isolated from the remainder of the epitaxial tub in which it exists.

If desired, prior to the aluminum diffusion, after region 29 is established at its desired dosage, it can be covered with a photoresist mask thereby leaving ring 27 exposed. Then a heavy ion implantation of aluminum is applied in an implant to increase the doping in the isolation ring 30A. Since this additional ion dose is applied prior to the aluminum diffusion step it acts to raise the doping level of the isolation well 30A. This reduces the resistance associated with the isolation wall.

During the aluminum diffusion heat treatment oxide layer 25 is reestablished. As an alternative, the oxide can be stripped off and a new oxide layer established. Then, as shown in FIG. 4, a hole is photolithographically created at 32 over the region where the PNP transistor is being established. Phosphorous ions 33 are implanted to create a region 34 of phosphorous-doped silicon. This implant is chosen for the desired PNP transistor base doping. A typical dose is about $6 \times 10^{14}$ atoms/cm$^2$ at about 100 keV. This will yield a doping of about 60 ohms/square. When the wafer is heated to about 1150° C. for about 80 minutes the phosphorous will diffuse to about the dashed line location to create the PNP transistor base 34A. During this diffusion oxide layer 25 is reformed.

At this point in device processing, a conventional NPN transistor base 36 of P type conductivity type is established as shown at 36. Then oxide 25 is photolithographically etched to create a hole at 37 and rings at 38 and 39. Hole 37 locates the PNP transistor emitter, ring 38 surrounds region 29A to act as a cap and to provide the PNP transistor collector contact, and ring 39 will provide a cap region for the aluminum isolation region 30A. Then an oxide 40 about 1700 Å thick is established at the bottom of hole 37 and rings 38 and 39 to act as a screen oxide. Then boron ions 41 are implanted at a dose of about $10^{16}$ atoms/cm$^2$ at an energy of about 75 keV. This relatively heavy dose will be concentrated mainly at the silicon surface because the ion energy is chosen to produce penetration of the screen oxide. Thus, heavily doped boron regions 41, 42 and 43 are created. A subsequent diffusion at about 1100° C. will produce relatively shallow heavily doped P+ regions shown at 41A, 42A and 43A in FIG. 6. The diffusion time is adjusted to produce the desired PNP transistor Beta. Region 41A is the PNP transistor emitter which can be tailored by the ion implant 41 and the subsequent heat treatment. Ring 42A provides a collector contact ring. Region 43A provides a high concentration cap for isolation diffusion region 30A. These latter two regions overlie aluminum diffusions and are important because regions 29A and 30A may be depleted of dopant at the oxide-semiconductor interface. Region 42A additionally acts as a guard ring over the collector region and prevents the occurrence of surface inversion by applied circuit voltages. In FIG. 6, the heavily doped regions are shown dashed where they intersect like conductivity type regions. Finally, NPN transistor emitter 44 is created in the conventional manner and N+ collector contact 45 is created simultaneously.

After the devices shown in FIG. 6 are created holes are photolithographically etched through oxide 25 at 46–52. The wafer is then metallized conventionally and the metal etched back to create metal contacts 53–59. Where the metal touches the semiconductor an ohmic connection exists. Contact 53 provides a topside contact to substrate 11 through the isolation wall. Contacts 54–56 respectively provide collector, base and emitter contacts for the PNP transistor. Contacts 57–59 respectively provide collector base and emitter contacts for the NPN transistor.

The NPN transistors can have their characteristics optimized in the conventional manner to suit their application. The PNP transistors can be optimized separately because the above-recited process steps permit the separate and independent control of their collector, base and emitter regions.

EXAMPLE

IC devices were constructed in accordance with the preferred embodiment using the above-described processing schedule for the PNP transistors and conventional processing for the NPN transistors. The PNP transistors had $f_t$ values of about 200 MHz. All of the devices were operable at over 40 volts. This is to be contrasted with the typical PNP lateral transistor which has a typical $f_t$ of about 5–10 MHz and the typical vertical substrate dedicated PNP transistor which has an $f_t$ of about 10–20 MHz. The PNP transistors could be tailored to produce Beta values of about 50 to about 300. This compares with typical NPN Beta values of between 100 and 500.

The invention has been described in terms of a preferred process and the results described. When a person skilled in the art reads the foregoing description, alternatives and equivalents, within the spirit and intent of the invention, will be apparent. For example, in the preferred embodiment, an isolation ring is shown surrounding a PNP and an NPN transistor. If desired, the ring can be converted to a figure eight configuration with each of the loops containing its own transistor. In this configuration, there would be another pedestal or isolation wall extending through epitaxial layer 24 between the two transistors illustrated in FIG. 6. Also, while ion implantation is preferred for impurity deposition, convention vapor phase diffusion deposition could be employed. Accordingly, it is intended that the scope of the invention be limited only by the following claims.

We claim:

1. A process for making a monolithic silicon, planar, PN-junction-isolated integrated circuit that contains high performance PNP transistors along with conventionally fabricated NPN transistors, said process including the steps combined with conventional processing comprising:

starting with a wafer of a first conductivity type and having a masking oxide thereon;

etching said oxide photolithographically to create holes in said oxide where PNP transistors are to be located;

applying a first dopant to said wafer wherein said first dopant is capable of doping said substrate to the opposite conductivity type;

diffusing said first dopant into said substrate to a first depth and simultaneously regrowing said oxide;

etching said regrown oxide photolithographically to create holes therein where said PNP transistors are to be located and where an isolation region is to be located;

applying a second dopant to said wafer wherein said second dopant is capable of overcoming said first dopant and of doping said substrate to said first conductivity type;

stripping any oxide from said wafer;

growing an epitaxial layer on said oxide-free wafer, said epitaxial layer having said opposite conductivity type and a resistivity selected to optimize said NPN transistor collectors;

forming a masking oxide on said epitaxial layer;

etching said formed masking oxide photolithographically to create holes therein where said PNP transistors and said isolation region are to be located;

applying a third dopant to said wafer wherein said third dopant is capable of doping said epitaxial layer to said first conductivity type and controlling said third dopant to optimize said PNP transistor collectors;

diffusing said third dopant into said epitaxial layer to an extent where it contacts said second dopant which diffused away from said substrate and into said epitaxial layer and simultaneously regrowing said oxide;

etching said regrown oxide photolithographically to create holes therein where PNP transistor bases are to be located;

applying a fourth dopant to said wafer wherein said fourth dopant is capable of producing said opposite conductivity and is controlled to optimize said PNP transistor bases;

diffusing said fourth dopant to extend into said epitaxial layer to an extent designed to create said PNP transistor bases and simultaneously reforming said oxide;

etching said reformed oxide photolithographically to create holes therein where said PNP transistor emitters are to be located;

applying a fifth dopant to said wafer, said fifth dopant being capable of doping said epitaxial layer to said first conductivity type and controlling said fifth dopant level to optimize said PNP transistor emitters;

diffusing said fifth dopant to a desired depth that is less than that of said fourth dopant and simultaneously reforming said oxide;

etching said reformed oxide photolithographically to create holes therein where PNP transistor contacts are to be applied; and forming PNP transistor contacts inside said holes in said oxide.

2. The process of claim 1 wherein said etching step that precedes the application of said fifth dopant wherein an additional ring is etched around the periphery of said third impurity deposit and another additional ring is etched in registry with said isolation region.

3. The process of claim 1 wherein said dopant deposition steps are applied using ion implantation.

4. The process of claim 3 including the step of forming a thin oxide on said wafer prior to the application of said fifth dopant whereby a screen is formed and said fifth dopant is applied through said screen.

5. The process of claim 1 wherein said third dopant is selected to have a higher diffusion rate in silicon than the other dopants.

6. The process of claim 5 wherein said first and second dopants are applied in registry with each other.

7. The process of claim 1 wherein said substrate is P-type, said first dopant is phosphorous, said second dopant is boron, said third dopant is aluminum, said fourth dopant is phosphorous and said fifth dopant is boron.

* * * * *